United States Patent
Choung et al.

(10) Patent No.: US 7,901,965 B2
(45) Date of Patent: Mar. 8, 2011

(54) THIN FILM TRANSISTOR SUBSTRATE AND METHOD OF MANUFACTURING THEREOF

(75) Inventors: Jong Hyun Choung, Suwon-si (KR); Hong Sick Park, Suwon-si (KR); Sun Young Hong, Seoul (KR); Bong Kyun Kim, Incheon (KR); Bong Kyu Shin, Bucheon-si (KR); Won Suk Shin, Yongin-si (KR); Byeong Jin Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 913 days.

(21) Appl. No.: 11/706,012

(22) Filed: Feb. 12, 2007

(65) Prior Publication Data

US 2007/0278487 A1 Dec. 6, 2007

(30) Foreign Application Priority Data

Jun. 5, 2006 (KR) .................. 10-2006-0050544

(51) Int. Cl.
*H01L 21/00* (2006.01)
(52) U.S. Cl. ............. 438/30; 349/43; 257/E21.679
(58) Field of Classification Search .......... 438/30; 349/43; 257/E21.679
See application file for complete search history.

(56) References Cited

U.S. PATENT DOCUMENTS

| 2004/0051823 | A1* | 3/2004 | Choi ........................ 349/43 |
| 2004/0246409 | A1 | 12/2004 | Jeon et al. |
| 2005/0112790 | A1* | 5/2005 | Lan et al. ................. 438/30 |
| 2007/0222908 | A1* | 9/2007 | Kim et al. ................. 349/43 |

FOREIGN PATENT DOCUMENTS

| JP | 2005-128555 | 10/2004 |
| KR | 2005-065703 | 12/2003 |

* cited by examiner

*Primary Examiner* — Charles D Garber
*Assistant Examiner* — Stanetta D Isaac
(74) *Attorney, Agent, or Firm* — Innovation Counsel LLP

(57) ABSTRACT

A thin film transistor substrate and a method of manufacturing the thin film transistor substrate comprises forming a gate line and a data line intersecting each other with a gate insulating layer interposed and defining a pixel area on the substrate, a thin film transistor electrically connected to the gate line and the data line, and a stepped-structure occurring pattern overlapping at least one of the gate line and the data line; forming a passivation layer having a stepped-structure portion formed by the stepped-structure occurring pattern on the substrate; forming a photoresist pattern having a second stepped-structure portion corresponding to the stepped-structure portion on the passivation layer; patterning the passivation layer using the photoresist pattern as a mask; forming a transparent conductive layer on the substrate; and removing the photoresist pattern where the transparent conductive layer is covered by a stripper penetrating through the stepped-structure portion of the photoresist pattern and forming a pixel electrode connected to the thin film transistor.

8 Claims, 19 Drawing Sheets

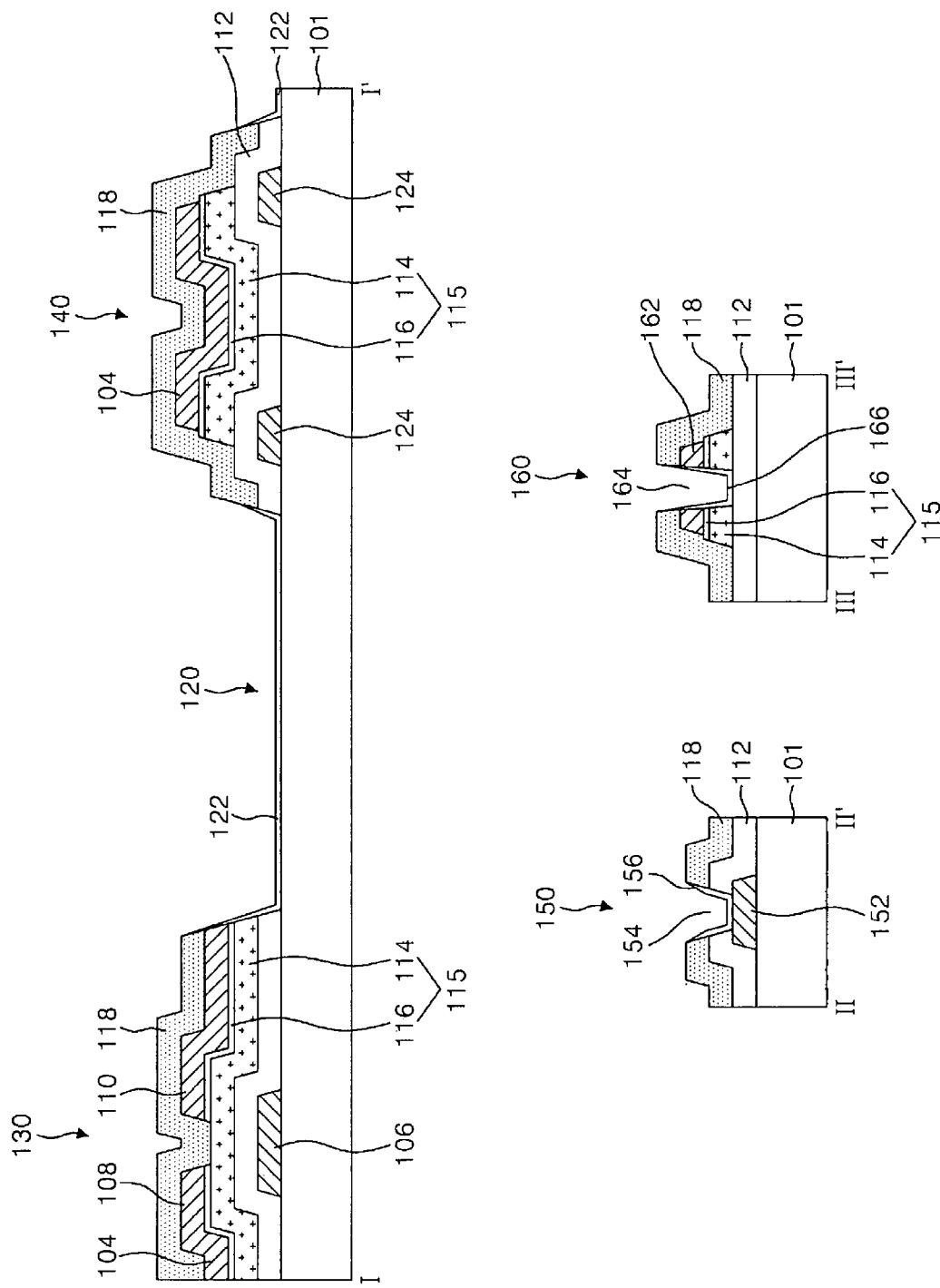

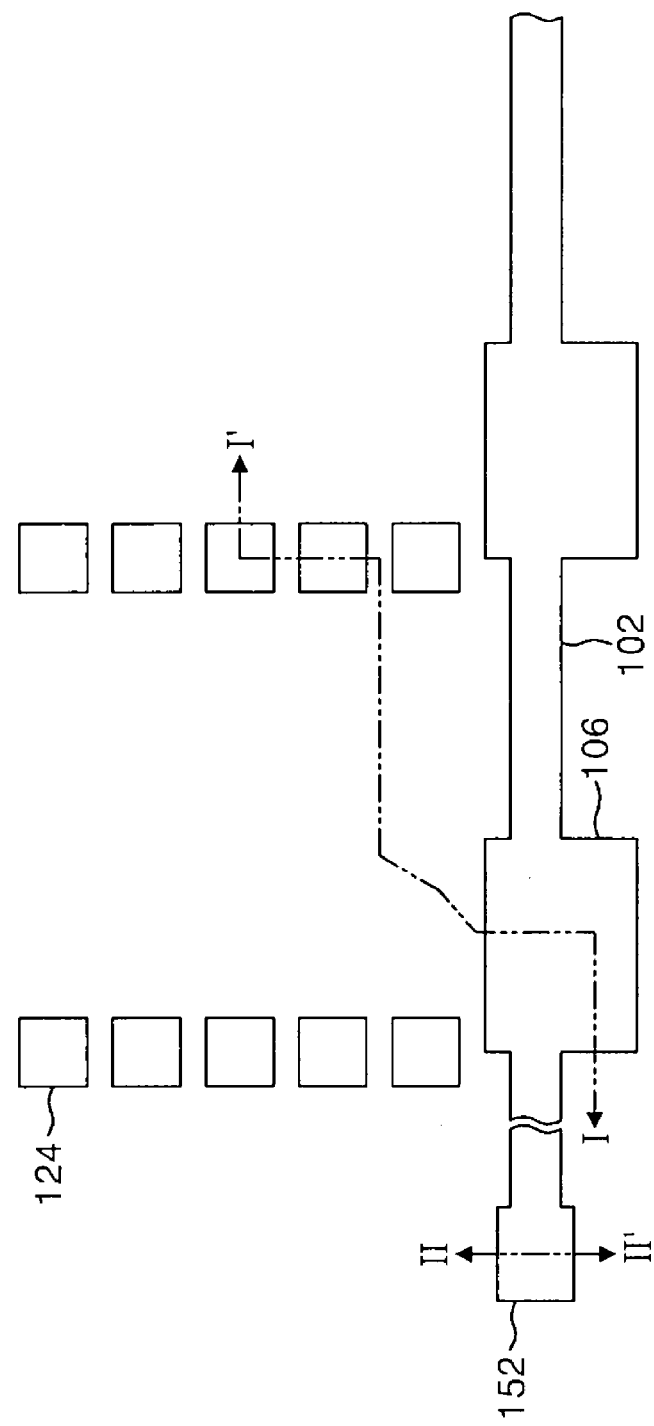

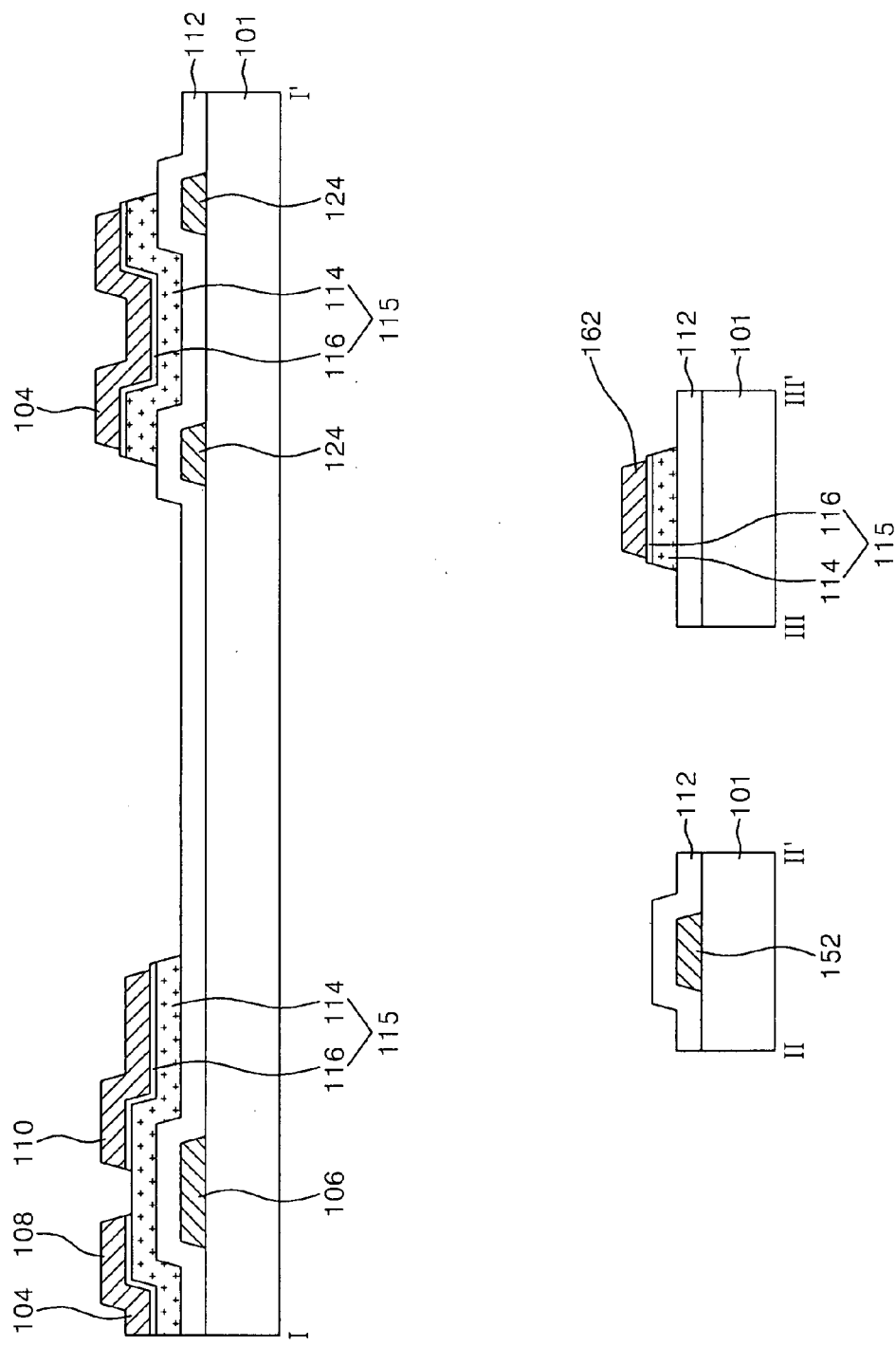

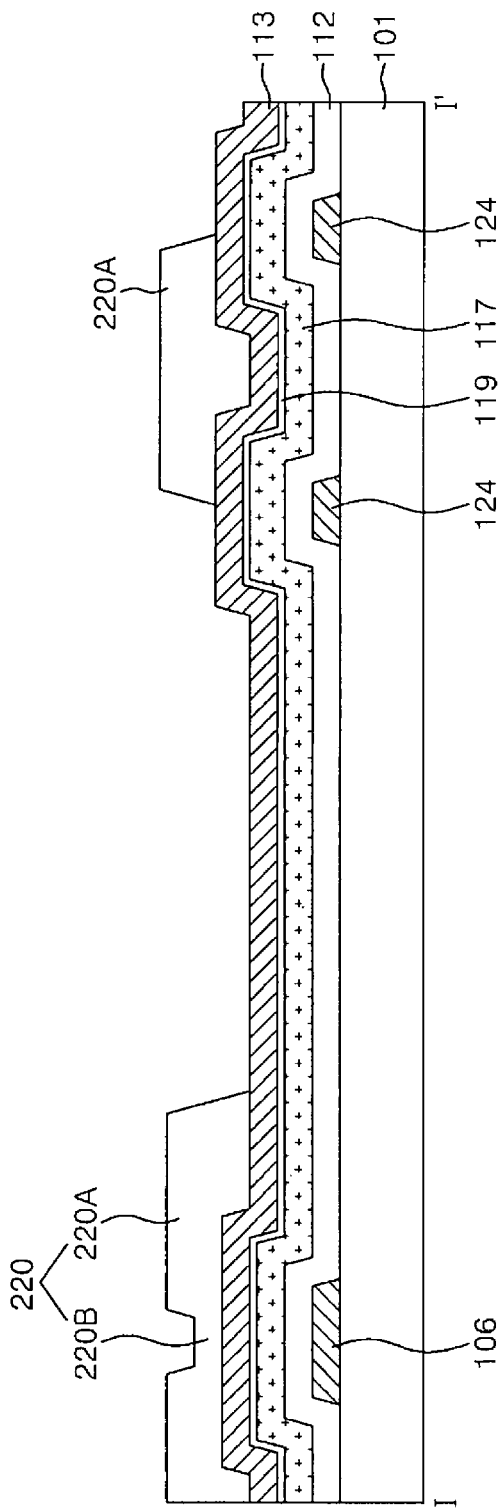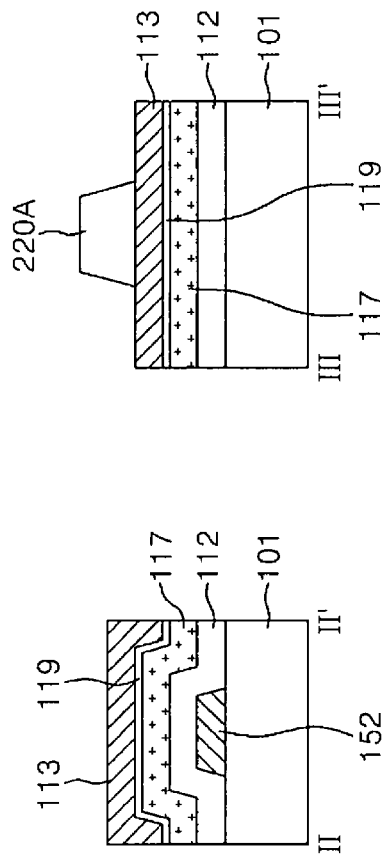
FIG.6A

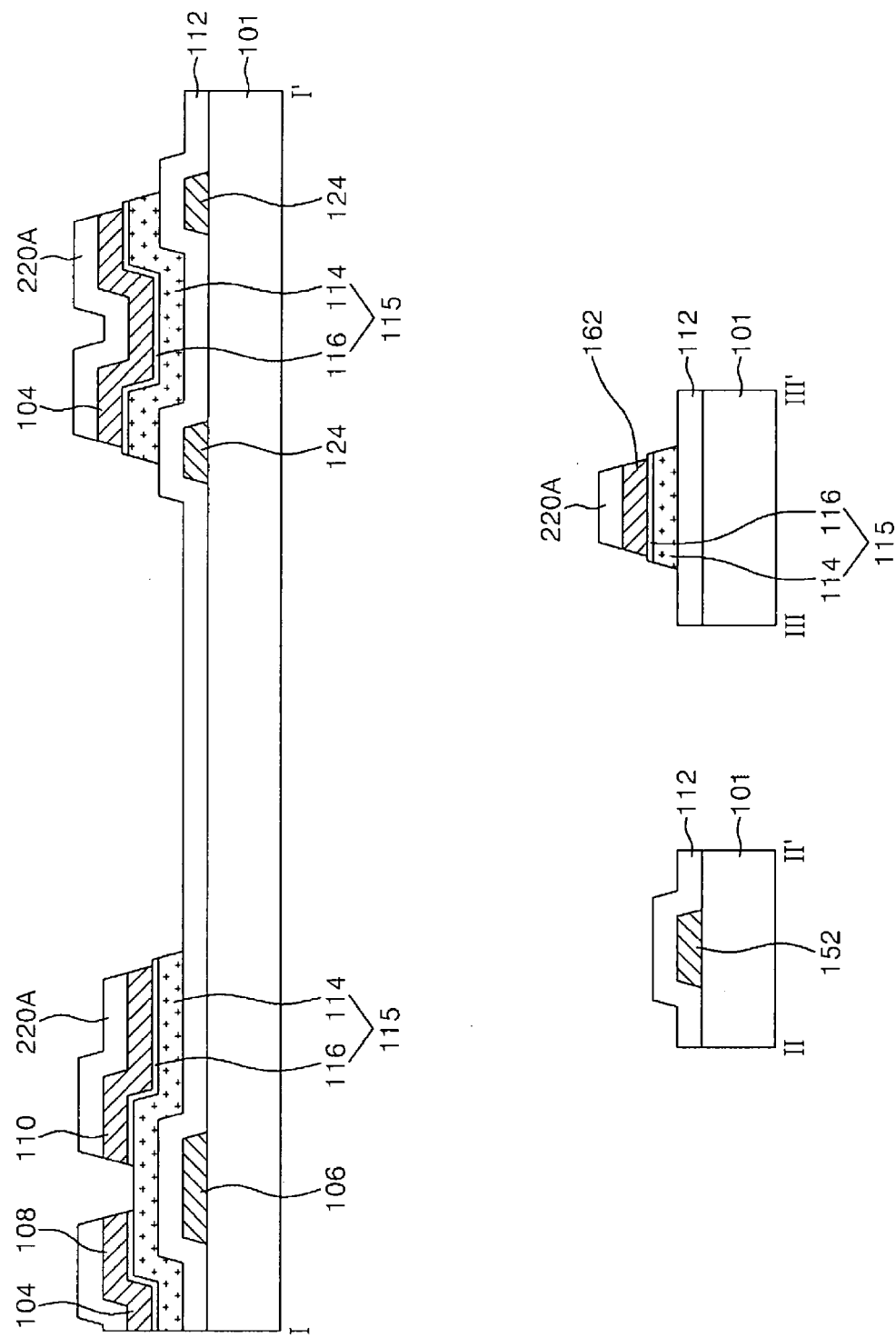

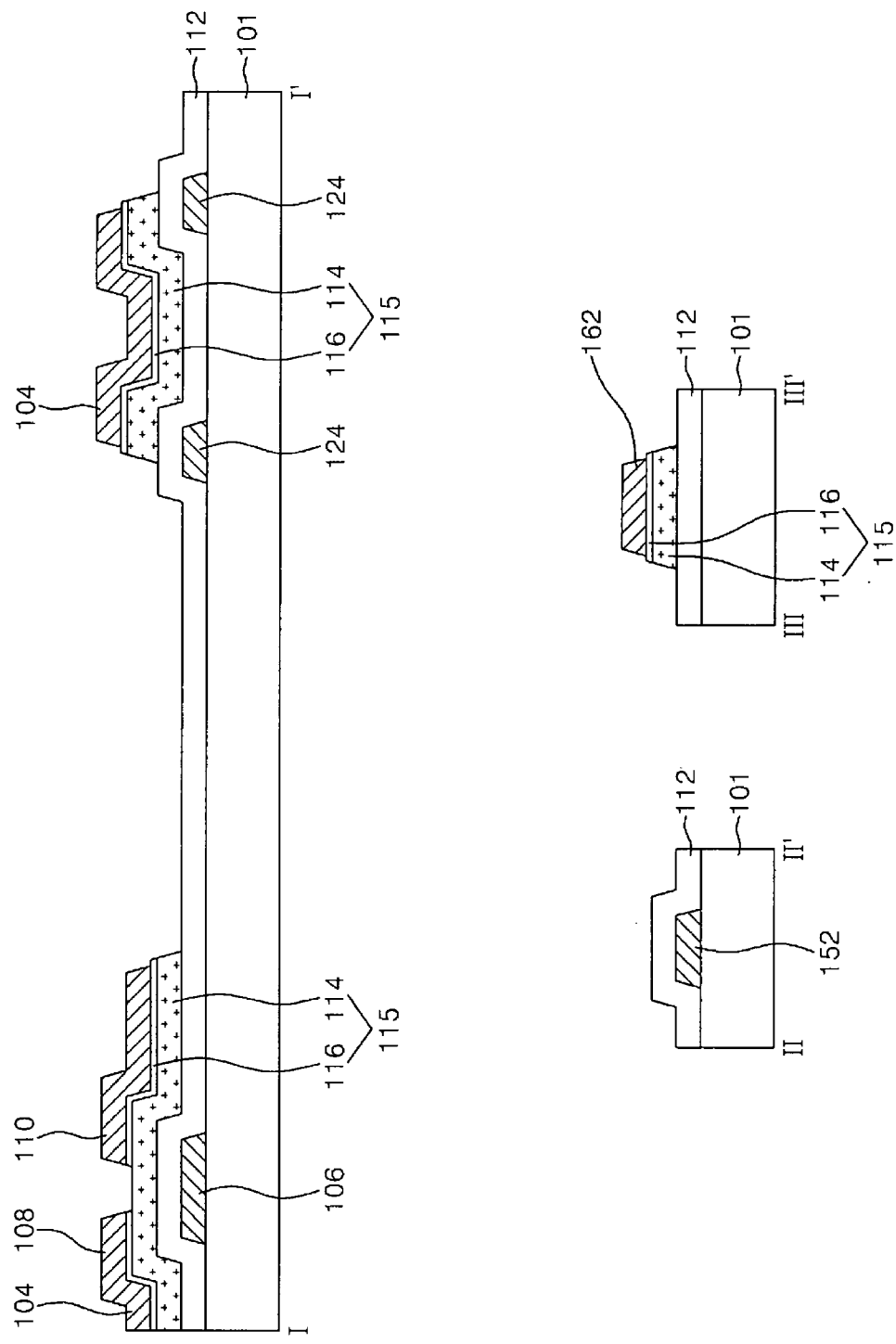

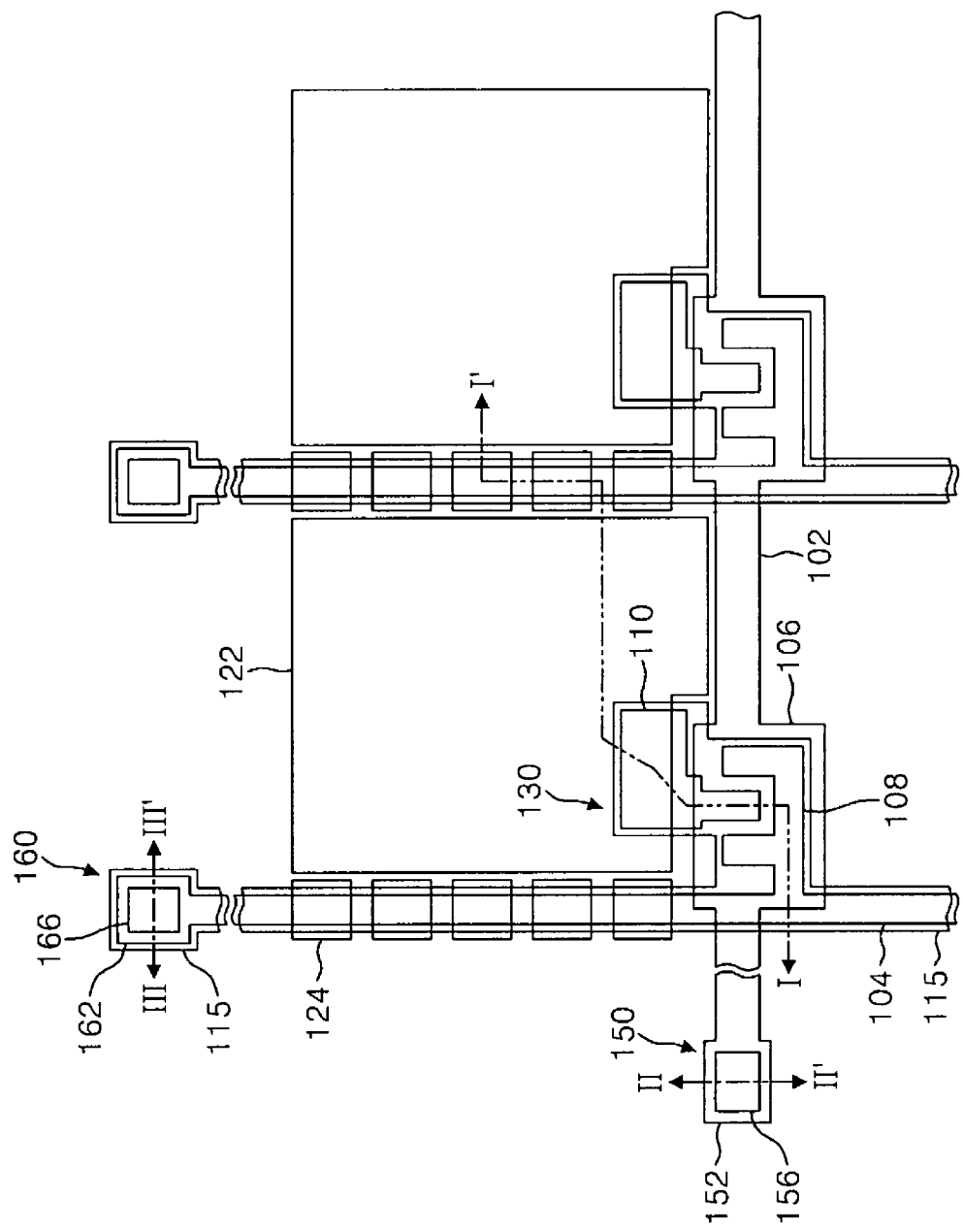

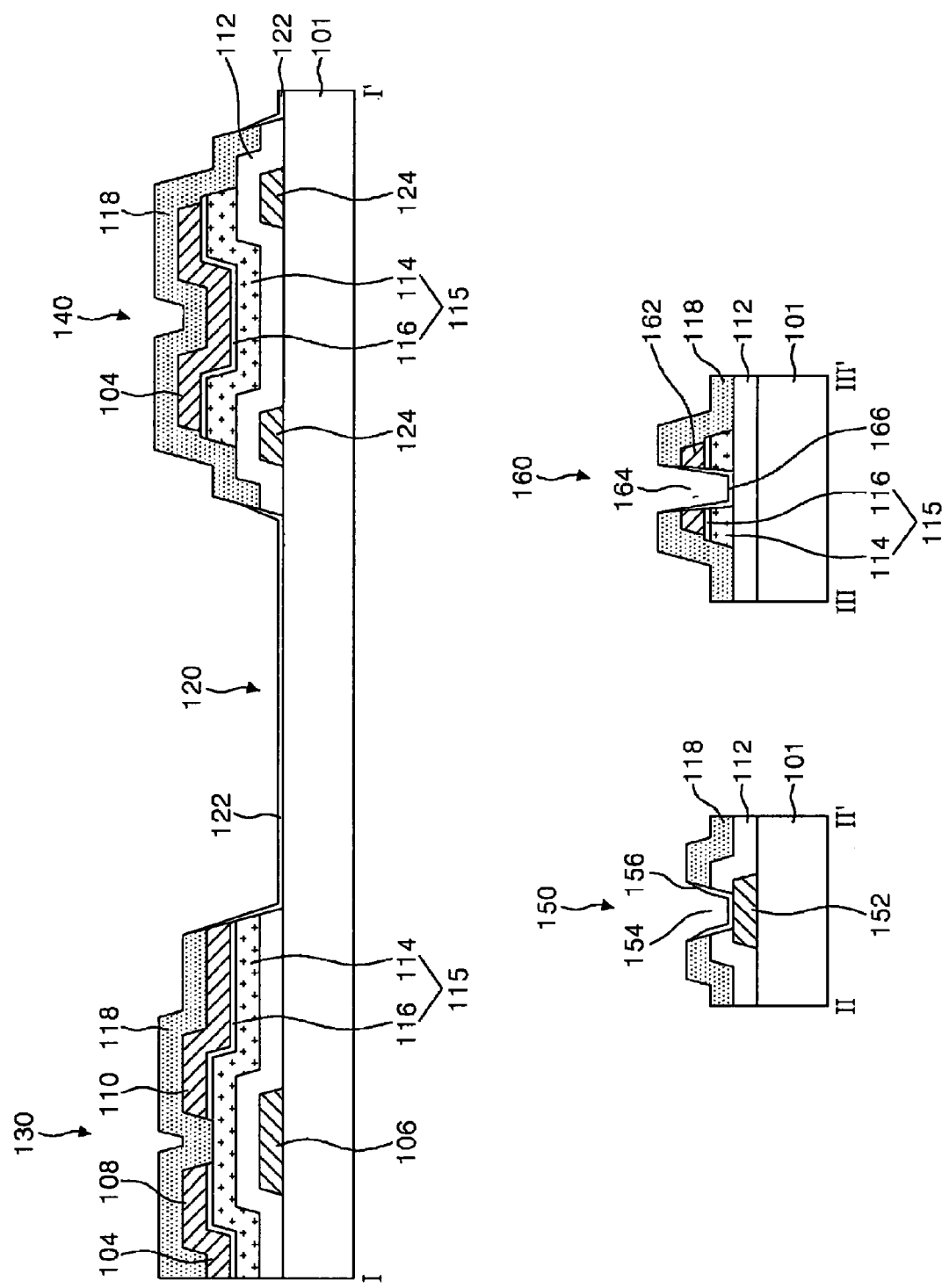

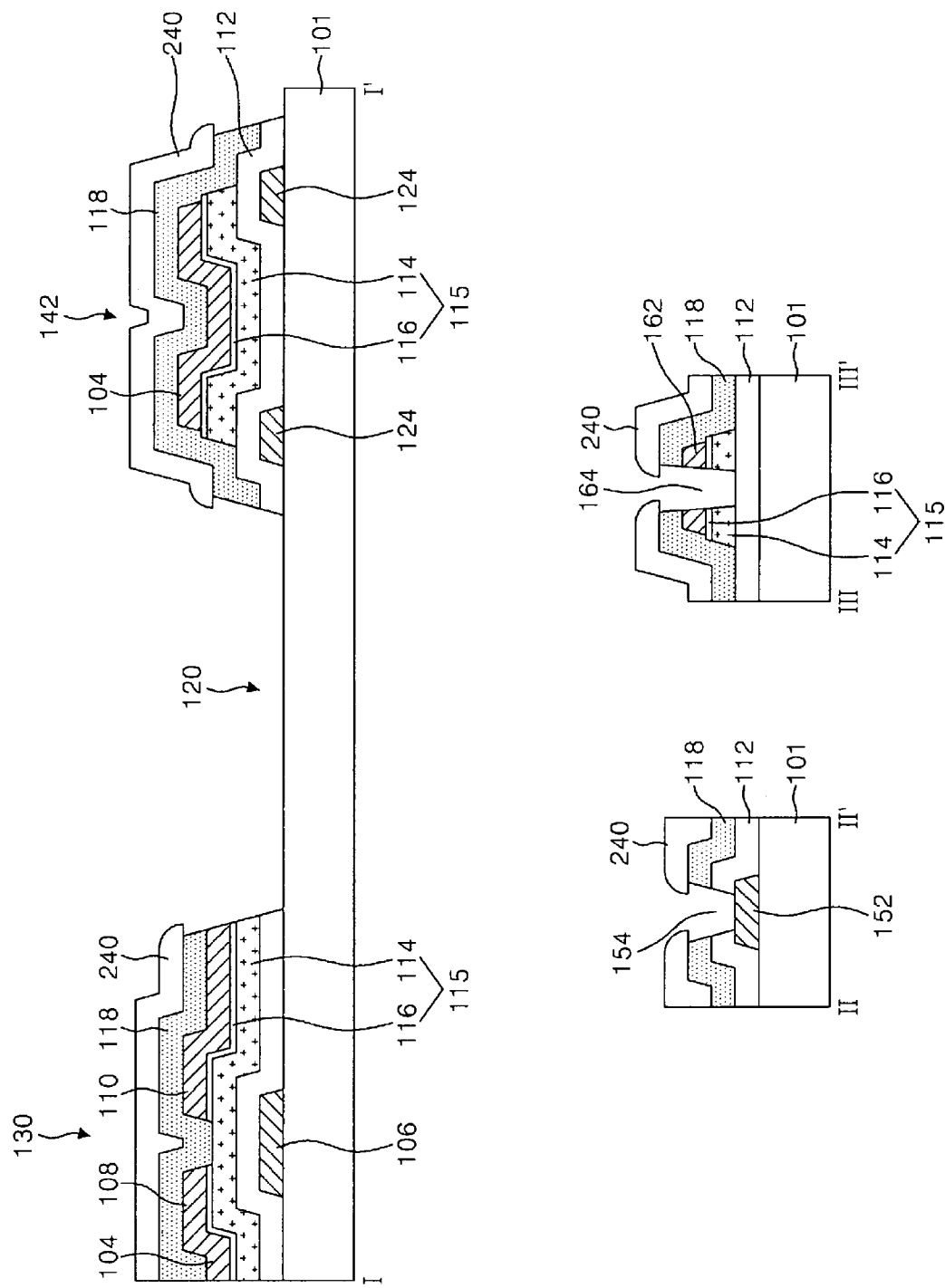

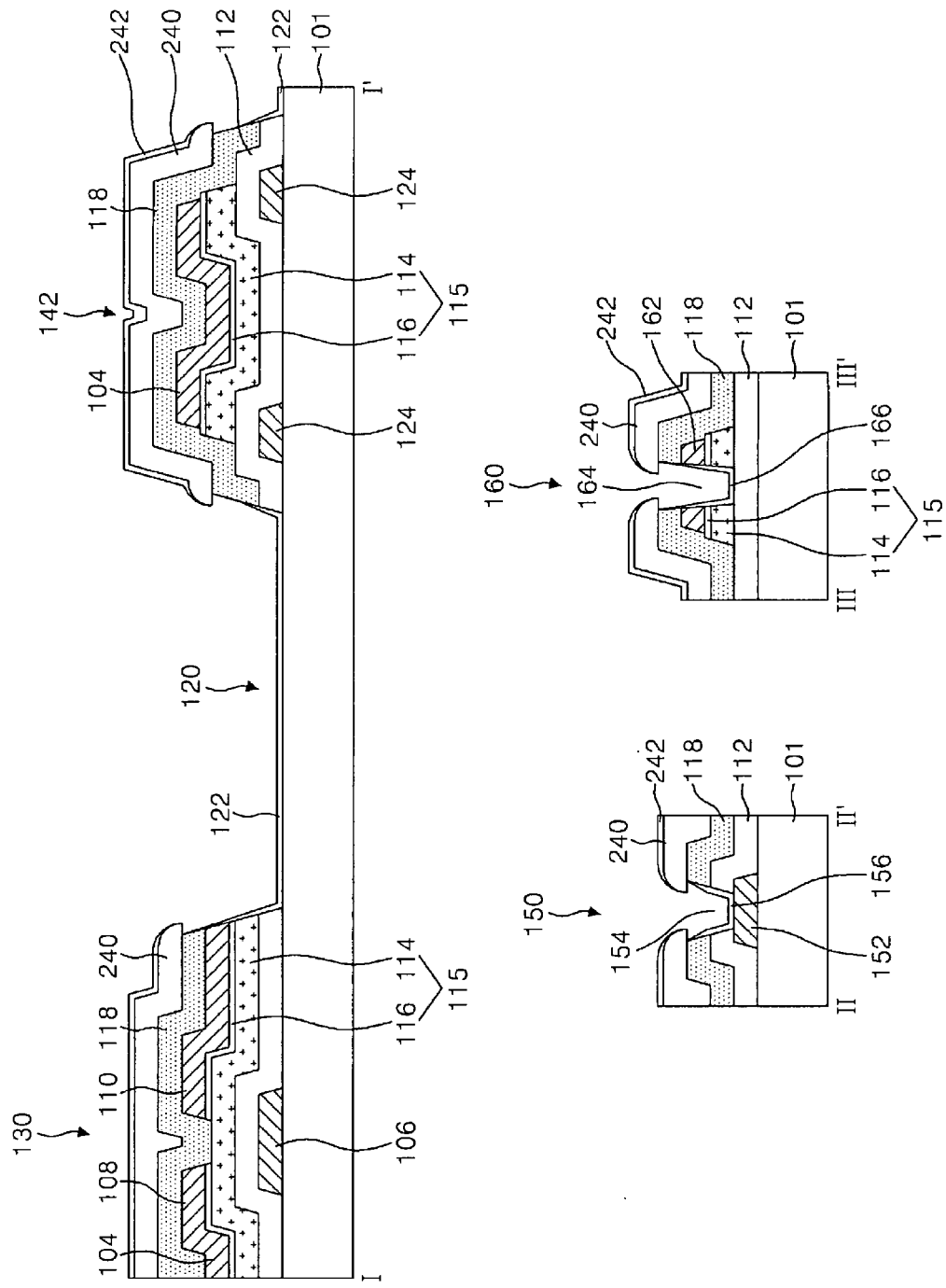

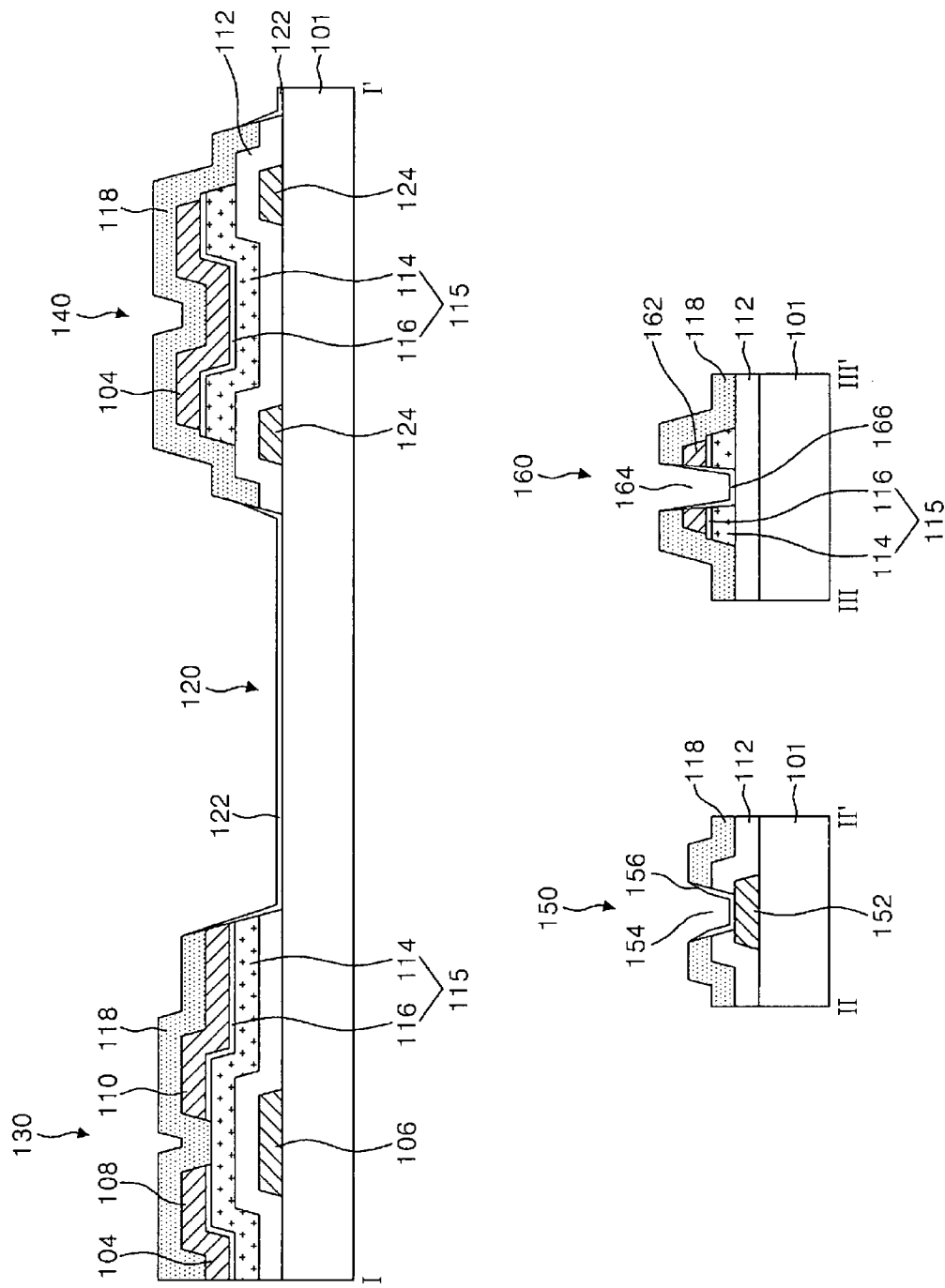

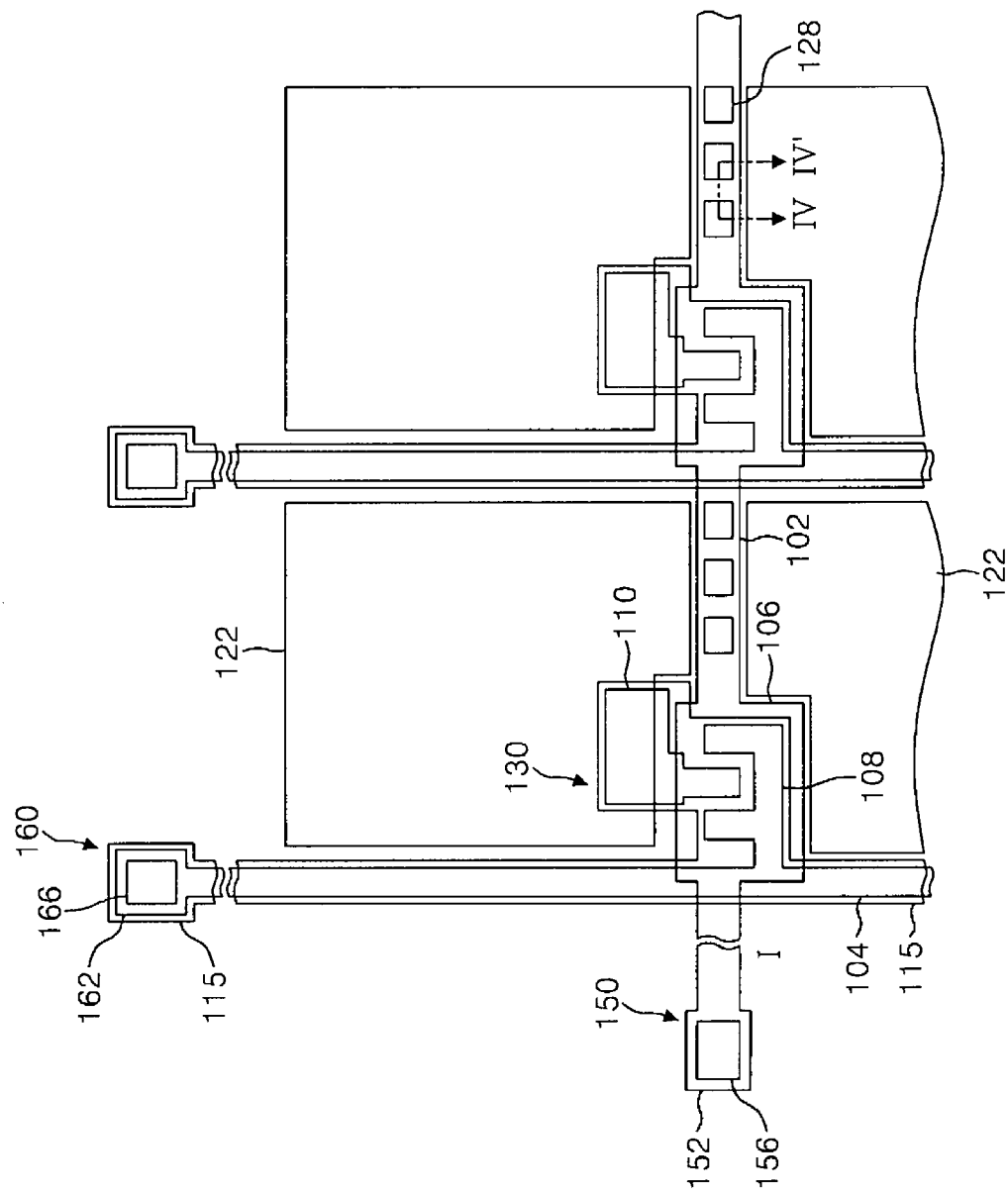

THIN FILM TRANSISTOR SUBSTRATE AND METHOD OF MANUFACTURING THEREOF

This application claims priority of, and all the benefits accruing under 35 U.S.C. §119, Korean Patent Application No. 2006-50544 (Patent) filed on Jun. 5, 2006, the contents of which are herein incorporated herein by reference.

FIELD OF THE INVENTION

The present invention relates to a display device having a thin film transistor ("TFT") substrate and, more particularly, to a TFT substrate made using an efficient lift-off process.

DESCRIPTION OF THE RELATED ART

Liquid crystal display ("LCD") display images by using an electric field to vary the light transmittance of the liquid crystal molecules having dielectric anisotropy. The LCD panel includes a color filter ("CF") substrate and a thin film transistor ("TFT") substrate which are formed using many mask processes including, for example, a thin film deposition (coating) process, an ashing process, a photolithography process, an etching process, a photoresist peeling process, a test process, a semiconductor process, etc. Recently, a lift-off process has been used to help reduce the number of mask processes required for forming the TFT substrate.

The lift-off process removes a photoresist pattern used to pattern a first thin film and a second thin film formed on the photoresist pattern together using a stripper to pattern the first and second thin films at the same time. However, due to physical/chemical influences between the photoresist pattern and the second thin film when the second thin film is deposited, the adhesive strength between the photoresist pattern and the second thin film is often enhanced while the photoresist pattern is degenerated. In this case, since the stripper does not properly penetrate the photoresist pattern due to the second thin film, the photoresist pattern is not stripped and remains on the substrate, causing further problems.

BRIEF SUMMARY OF THE INVENTION

The present invention provides a thin film transistor ("TFT") substrate and a simplified method of manufacturing the TFT substrate in which a stepped-structure pattern partially overlaps at least one of the gate lines and data lines on the surface of a passivation layer. In one embodiment the stepped-structure pattern is formed of the same material as a gate line on the substrate so as to partially overlap a data line and a semiconductor pattern.

A second embodiment of the stepped-structure occurring pattern is formed of the same material as the data line on the gate insulating layer so as to partially overlap the gate line.

The TFT substrate further comprises a connecting pattern formed between the stepped-structure patterns to connect the stepped-structure patterns to each other.

The width of the connecting pattern may be constant or may gradually increase toward the stepped-structure occurring patterns.

Further, the TFT substrate further comprises a gate pad electrically connected to the gate line, wherein the gate pad comprises a gate pad lower electrode extended from the gate line; and a gate pad upper electrode formed within a contact hole penetrating the passivation layer and the gate insulating layer and electrically connected to the gate pad lower electrode.

The TFT substrate further comprises a data pad electrically connected to the data line, wherein the data pad comprises a data pad lower electrode extended from the data line; and a data pad upper electrode formed within a contact hole penetrating the semiconductor pattern, the data pad lower electrode, and the passivation layer and electrically connected to the data pad lower electrode.

A method of manufacturing the TFT substrate according to the present invention comprises forming a gate line and a data line defining a pixel area with a gate insulating layer interposed on a substrate, forming a thin film transistor electrically connected to the gate line and the data line, and a stepped-structure occurring pattern overlapping at least one of the gate line and the data line; forming a passivation layer having a stepped-structure portion on the substrate; forming a photoresist pattern having a second stepped-structure portion corresponding to the stepped-structure portion on the passivation layer; patterning the passivation layer using the photoresist pattern as a mask; forming a transparent conductive layer on the substrate; and removing the photoresist pattern where the transparent conductive layer is covered by a stripper penetrating through the stepped-structure portion of the photoresist pattern and forming a pixel electrode electrically connected to the thin film transistor.

A first embodiment of forming a gate line, a data line, a thin film transistor, and a stepped-structure occurring pattern comprises forming a gate metal pattern including the gate line, the gate electrode of the thin film transistor, and the stepped-structure occurring pattern on the substrate; forming a gate insulating layer covering the gate line, the gate electrode, and the stepped-structure occurring pattern, forming a semiconductor pattern on the gate insulating layer, and forming source/drain metal patterns including the data line overlapping the stepped-structure occurring pattern.

A second embodiment of forming the gate line, the data line, the thin film transistor, and the stepped-structure occurring pattern comprises forming a gate metal pattern including the gate line and the gate electrode of the thin film transistor on the substrate; forming a gate insulating layer covering the gate line and the gate electrode, forming a semiconductor pattern on the gate insulating layer, and forming source/drain metal patterns including a stepped-structure occurring pattern overlapping the gate line, the data line, the source electrode and the drain electrode of the thin film transistor on the semiconductor pattern.

The semiconductor pattern is formed along with the source/drain metal patterns by one mask process using a slit mask or a half-tone mask.

BRIEF DESCRIPTION OF THE DRAWING

The above and other objects, features and advantages of the present invention will become more apparent from a reading of the ensuing description together with the drawings, in which:

FIG. 2 is a cross-sectional views taken along lines I-I', II-II', and III-III' of the TFT substrate shown in FIG. 1;

FIGS. 4a and 4b are a plan view and cross-sectional views, respectively, for illustrating a first mask process of the TFT substrate in accordance with an exemplary embodiment of the present invention;

FIGS. 5a and 5b are a plan view and cross-sectional views, respectively, for illustrating a second mask process of the TFT substrate in accordance with an exemplary embodiment of the present invention;

FIGS. 6a to 6d are cross-sectional views for in detail illustrating the second mask process in accordance with the present invention;

FIGS. 7a and 7b are a plan view and cross-sectional views, respectively, for illustrating a third mask process of the TFT substrate according to the first exemplary embodiment of the present invention;

FIGS. 8a to 8d are cross-sectional views for in detail illustrating the third mask process according to the present invention;

FIG. 9 is a plan view showing a part of the TFT substrate in accordance with a second exemplary embodiment of the present invention.

DETAILED DESCRIPTION OF THE INVENTION

Figure 1:
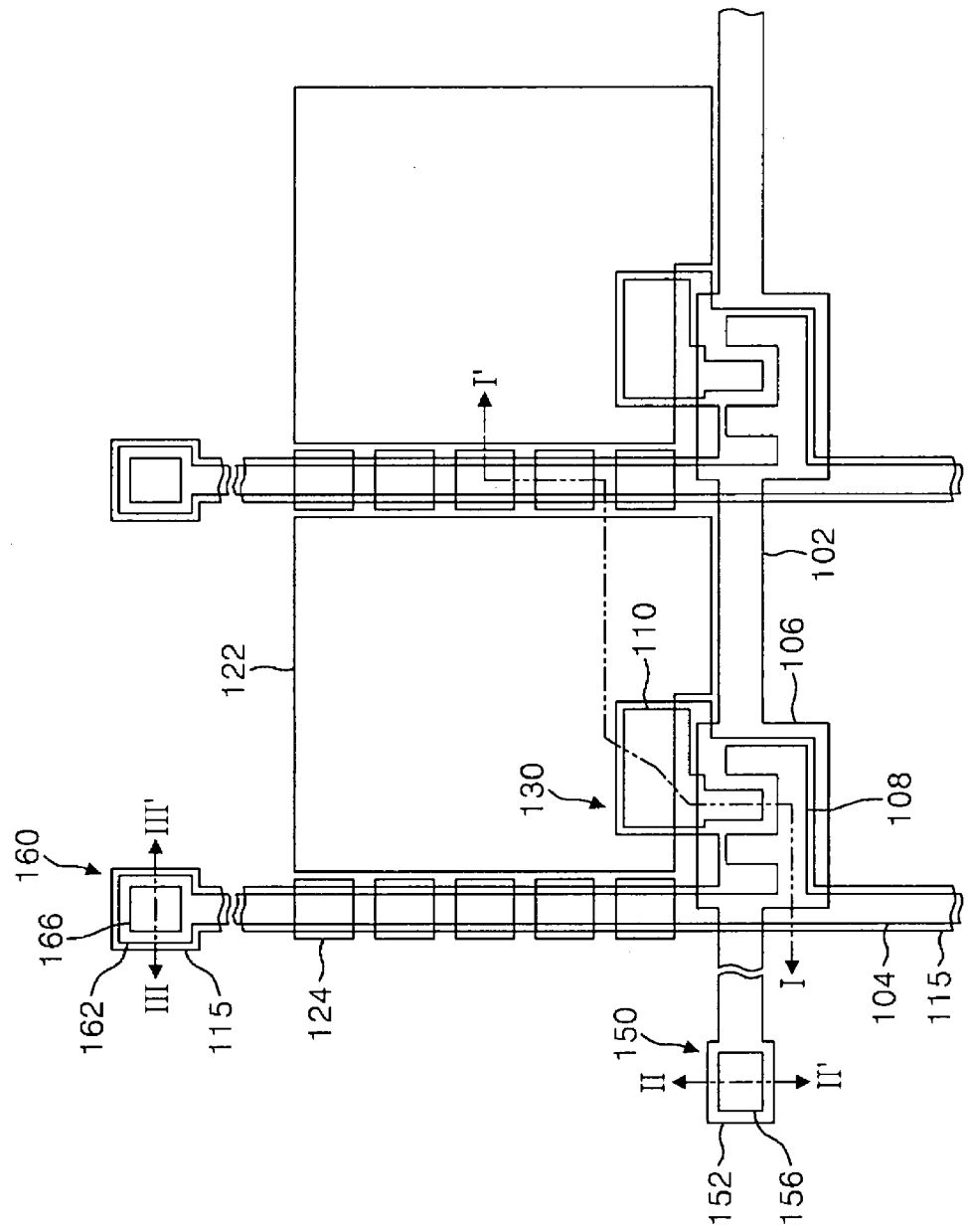
FIG. 1 is a plan view showing a part of a thin film transistor ("TFT") substrate in accordance with a first exemplary embodiment of the present invention.

The TFT substrate shown in FIGS. 1 and 2 comprises a TFT 130 electrically connected to a gate line 102 and a data line 104, respectively, a pixel electrode 122 formed in a sub-pixel area formed at the intersected structure between the gate and data lines, a gate pad 150 electrically connected to gate line 102, a data pad 160 electrically connected to data line 104, and a stepped-structure occurring pattern 124 located under data line 104.

TFT 130, by means of a pixel signal supplied to data line 104 and a scan signal delivered by gate line 102, charges and maintains a charge on pixel electrode 122. TFT substrate 130 comprises a gate electrode 106 electrically connected to gate line 102, a source electrode 108 electrically connected to data line 104, a drain electrode 110 facing source electrode 108 and electrically connected to pixel electrode 122. Gate insulating layer 112 is interposed between gate electrode 106 and active layer 114 which overlaps gate electrode 106. Active layer 114 forms a channel between source electrode 108 and drain electrode 110. An ohmic contact layer 116 is formed on active layer 114, except for the channel, and provides an ohmic contact with the source and drain electrodes 108, 110.

A semiconductor pattern 115 including active layer 114 and ohmic contact layer 116 is formed to overlap data line 104 in the process.

A pixel hole 120 penetrating passivation layer 118 is formed in a sub-pixel area defined by the intersected structure between gate line 102 and data line 104. Pixel electrode 122 forms a boundary with the side surfaces of passivation layer 118 within pixel hole 120. Pixel electrode 122 is formed on the lower substrate 101 within pixel hole 120 and is electrically connected to drain electrode 110 whose side is exposed.

Pixel electrode 122 receives the pixel signal supplied from TFT 130 and together with the common electrode formed on a color filter ("CF") substrate (not shown) generates a potential difference in the liquid crystal disposed between the TFT substrate and the CF substrate. Because the liquid crystal exhibits dielectric anisotropy, the potential difference causes the liquid crystal molecules to rotate thereby varying the amount of light transmitted toward the CF substrate.

Gate pad 150 supplies a scan signal to gate line 102 from a gate driver (not shown). Gate pad 150 comprises gate pad lower electrode 152 extended from gate line 102 and a gate pad upper electrode 156 formed within gate contact hole 154 penetrating passivation layer 118 and gate insulating layer 112 and electrically connected to gate pad lower electrode 152. Gate pad upper electrode 156 forms a boundary with the side surfaces of passivation layer 18 within gate contact hole 154.

Data pad 160 supplies the pixel signal from a data driver (not shown) to data line 104. Data pad 160 comprises data pad lower electrode 162 extended from data line 104 and data pad upper electrode 166 formed within data contact hole 164 penetrating passivation layer 118, ohmic contact layer 116, and active layer 114. Data pad upper electrode 166 is connected to the side surfaces of data pad lower electrode 162. Data pad lower electrode 162 is formed to overlap semiconductor layer 115 including ohmic contact layer 116 and the active layer 114 formed under electrode 116. Data pad upper electrode 166 forms a boundary with the side surfaces of the passivation layer within the data contact hole 164.

The stepped-structure occurring patterns 124 are formed to at least partially overlap data line 104, and semiconductor pattern 115. Stepped-structure occurring pattern 124 is formed of the same metal as gate line 102 on the lower substrate 101. Stepped-structure occurring pattern 124 is formed to have a line width more than that of semiconductor pattern 115 but not so wide as to adversely affect the aperture ratio. Stepped-structure occurring pattern 124 is used as a light blocking layer which prevents semiconductor pattern 115 located under data line 104 from being exposed to the backlight (not shown) and being activated by the backlight.

Figure 3A:
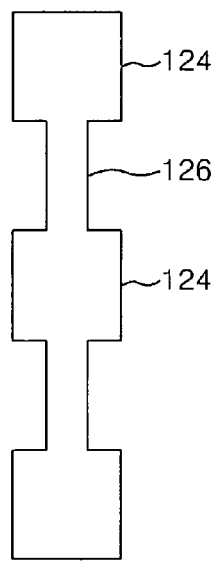
FIGS. 3a and 3b are plan views showing connecting patterns connecting stepped-structure occurring patterns shown in FIG. 1.
Figure 3B:
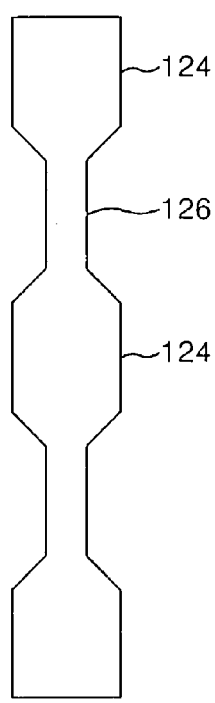

As shown in FIG. 1, the stepped-structure occurring pattern 124 comprises segments spaced apart from each other on lower substrate 101. Alternatively, as shown in FIG. 3a, the stepped-structure occurring pattern 124 may be formed to be connected by connecting pattern 126 having a line width narrower than the stepped-structure occurring pattern 124. As shown in FIG. 3b, as the connecting pattern 126 becomes increasingly close to the stepped-structure occurring pattern 124, the width of the connecting pattern 126 may gradually increase to that of stepped-structure occurring pattern 124. Connecting pattern 126 is used as a light blocking layer along with the stepped-structure occurring pattern 124. In other words, connecting pattern 126 prevents semiconductor pattern 115 from being activated by light emitted between the spaced-apart segments of the stepped-structure occurring patterns 124 shown in FIG. 1.

Stepped-structure occurring pattern 124 forms a stepped-structure portion 140 formed on gate insulating layer 112, active layer 114, ohmic contact layer 116, data line 104, and passivation layer 118 formed thereon. In particular, stepped-structure portion 140 is also formed in the photoresist pattern used for patterning passivation layer 118 and a transparent conductive pattern along the stepped-structure portion 140 formed in passivation layer 118. Stepped-structure portion 140 formed in the photoresist pattern provides a better penetrating path for a stripper, thereby improving the efficiency of the lift-off process.

Figure 4B:
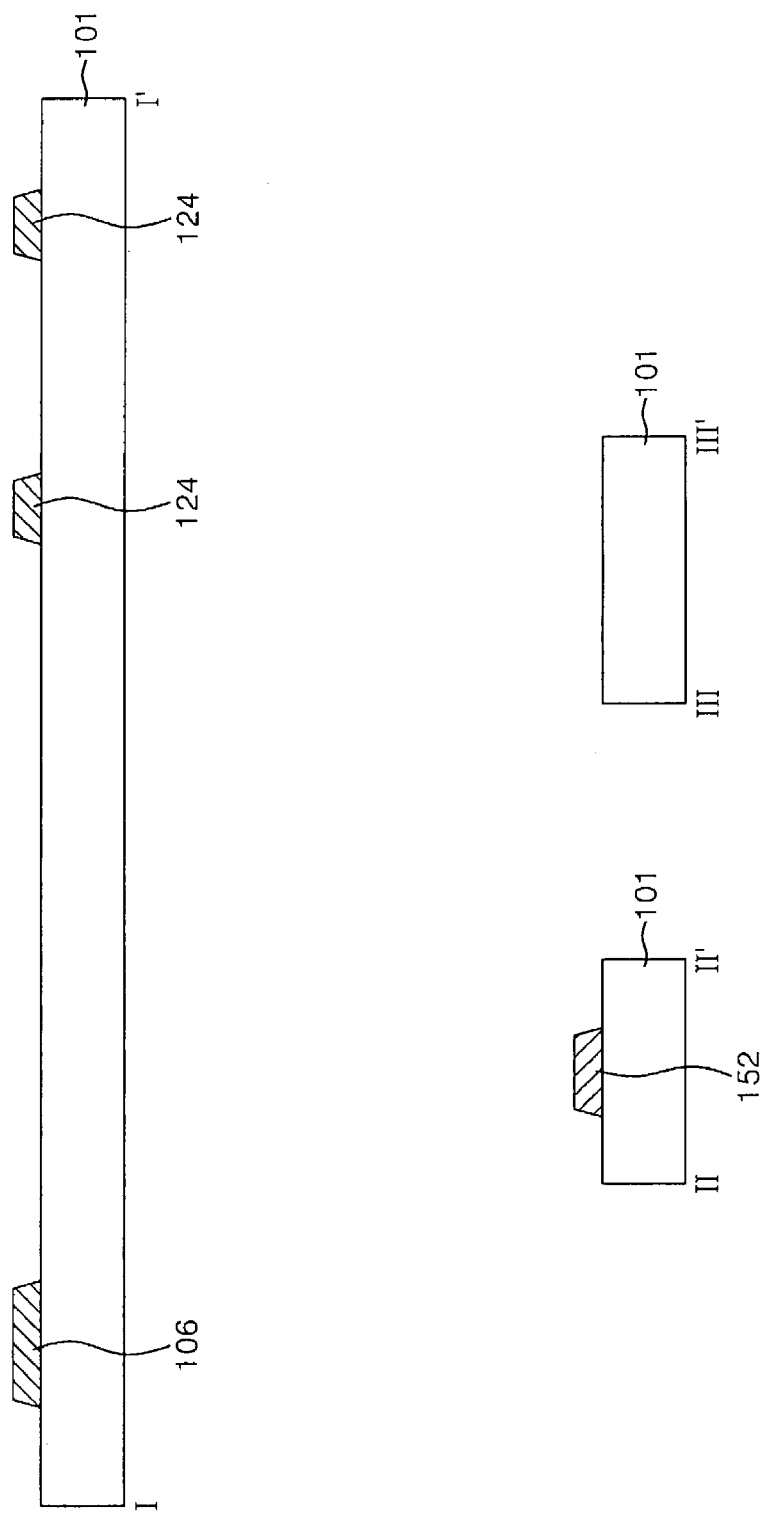

FIGS. 4a and 4b are a plan view and cross-sectional views, respectively, for illustrating a first mask process of the TFT substrate in accordance with an exemplary embodiment of the present invention.

A gate metal pattern including gate line 102, gate electrode 106, gate pad lower electrode 152 and the stepped-structure occurring pattern 124 is formed on lower substrate 101 using the first mask process.

Specifically, the gate metal layer is formed on lower substrate 101 by a deposition method, such as, a sputtering, etc. The gate metal layer may have a single layer of a metal material, such as Mo, Ti, Cu, AlNd, Al, Cr, Mo alloy, Cu alloy, Al alloy, etc. or a double-layered structure, or more. Then, the gate metal layer is patterned by a photolithography process and an etching process using the first mask to form the gate metal pattern including gate line 102, gate electrode 106, gate pad lower electrode 152, and the stepped-structure occurring pattern 124.

Figure 5A:
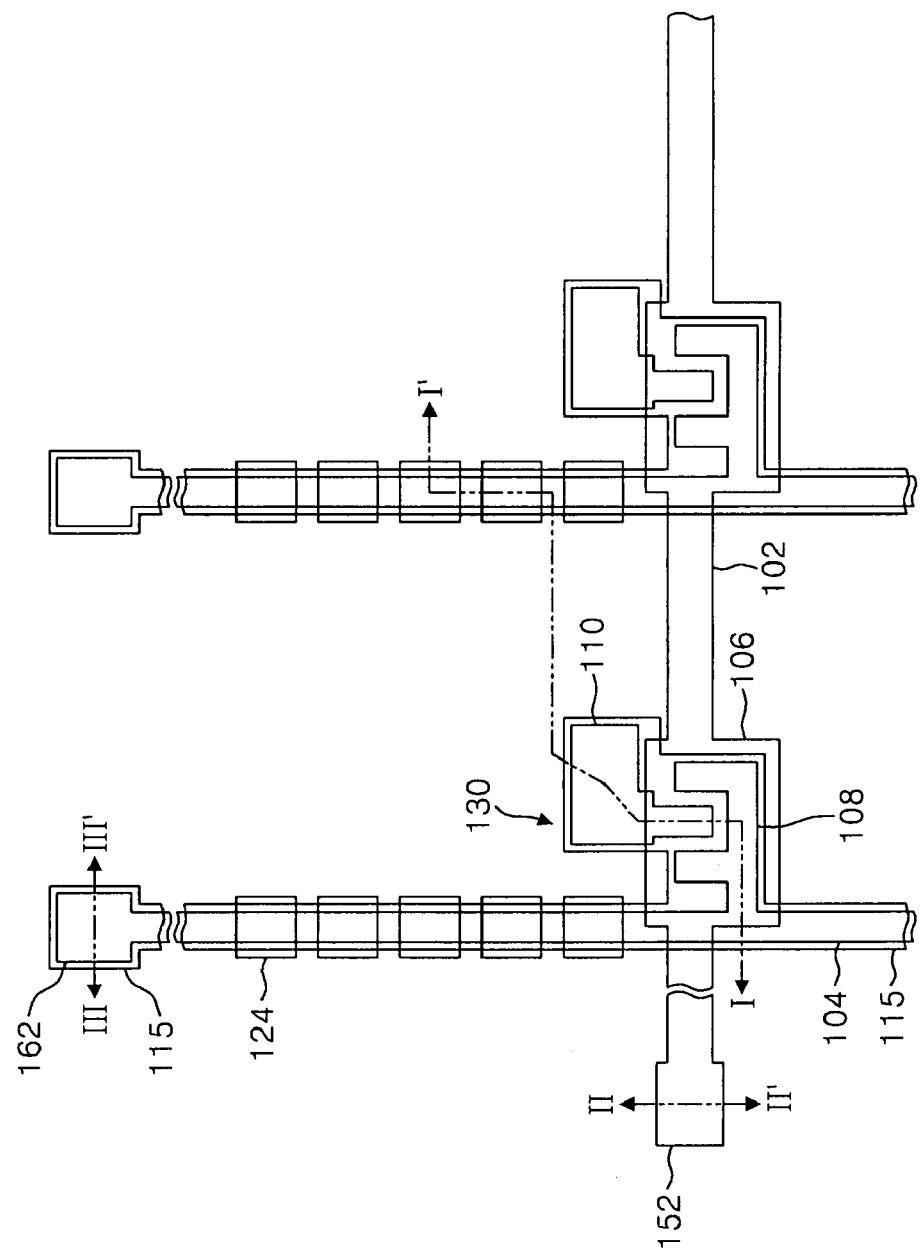

FIGS. 5a and 5b are a plan view and cross-sectional views, respectively, for illustrating a second mask process of the TFT substrate in accordance with an exemplary embodiment of the present invention and FIGS. 6a to 6d are cross-sectional views for in detail illustrating the second mask process in accordance with the present invention.

Gate insulating layer 112, active layer 114, ohmic contact layer 116 and the source/drain metal layer are sequentially formed on lower substrate 101. Then source/drain metal patterns and semiconductor patterns are formed by a second mask process. At this time, the source/drain metal patterns include data line 104, source electrode 108, drain electrode 110, data pad lower electrode 162, and semiconductor pattern 115 which includes active layer 114 and ohmic contact layer 116. Semiconductor pattern 115 and the source/drain metal patterns are formed by one mask process using a slit mask or a half tone mask. Hereinafter, only an embodiment of using a slit mask will be described as an example.

Referring to FIG. 6a, gate insulating layer 112, an amorphous silicon layer 117, an impurity (n+or p+) doped amorphous silicon layer 119, and source/drain metal layers 113 are sequentially formed on the lower substrate 101 where the gate metal pattern is formed. For example, gate insulating layer 112, amorphous silicon layer 117, and impurity doped amorphous silicon layer 119 are formed using a sputtering method. Gate insulating layer 112 may be an inorganic insulating material, such as, silicon oxide (SiOx), silicon nitride (SiNx), etc. and the source/drain metal layers 113 use a single layer of a metal material, such as, Mo, Ti, Cu, AlNd, Al, Cr, Mo alloy, Cu alloy, Al alloy, etc. or a double-layered structure or more. A photoresist is deposited on source/drain metal layers 113 and then the photoresist is exposed and developed by a photolithography process using the slit mask to form a photoresist pattern 220 having a stepped-structure.

Specifically, the slit mask comprises a blocking area where a blocking layer is formed on a quartz substrate, a slit area where a plurality of slits are formed on the quartz substrate, and a transmitting area where only the quartz substrate exists. The blocking area is located at an area where the semiconductor pattern and the source/drain metal patterns will be formed to block ultraviolet rays, thereby remaining a first photoresist pattern 220A after development, as shown in FIG. 6a. The slit area is located in an area where the channel of the TFT will be formed, and diffracts ultraviolet rays, thereby remaining a second photoresist pattern 220B thinner than the first photoresist pattern 220A after development, as shown in FIG. 6a. The transmitting area transmits all of ultraviolet rays, thereby removing the photoresist after development, as shown in FIG. 6a.

Figure 6B:
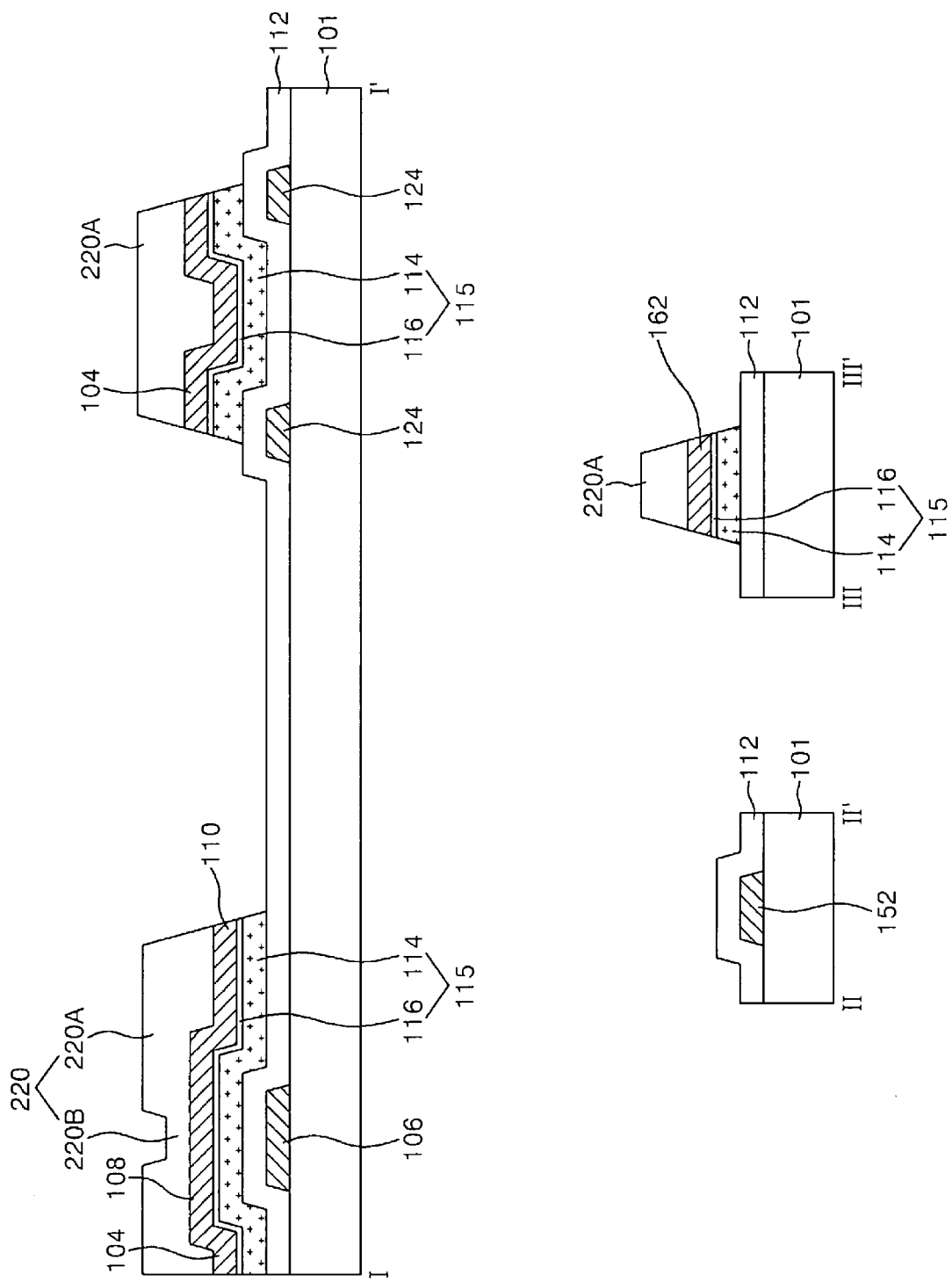

The source/drain metal layers 113 are patterned by an etching process using the photoresist pattern 220 having a stepped-structure to form the source/drain metal patterns and semiconductor pattern 115 thereunder, as shown in FIG. 6b. In this case, the source electrode 108 and the drain electrode 110 of the source/drain metal patterns have a structure connected to each other.

Then, by ashing the photoresist pattern 220 by an ashing process using $O_2$ plasma, as shown in FIG. 6c, the first photoresist pattern 220A becomes thin and the second photoresist 220B is removed. Then, a second conductive pattern group are patterned by an etching process using the first photoresist pattern 220A, and the ohmic contact layer 116 formed thereunder are removed to separate the source electrode 108 and the drain electrode 110 and expose the active layer 114. At this time, the source/drain metal patterns and semiconductor pattern 115 may have a stepwise of a constant stepped-structure due to a difference of the etching characteristics. For example, due to a difference between etching rates of the source/drain metal patterns formed by an isotropy etching and the semiconductor pattern formed by an anisotropy etching, a stepped-structure may be generated. The first photoresist pattern 220A remaining on the source/drain metal patterns is then removed by a strip process, as shown in FIG. 6d.

FIGS. 7a and 7b are a plan view and cross-sectional views, respectively, for illustrating a third mask process of the TFT substrate in accordance with the first exemplary embodiment of the present invention and FIGS. 8a to 8d are cross-sectional views for in detail illustrating the third mask process in accordance with the present invention.

Passivation layer 118 including the pixel hole 120 and the gate contact hole 154, and the data contact hole 164 is formed using a third mask process, and the transparent conductive pattern including pixel electrode 122, and the gate pad upper electrode 156 and the data pad upper electrode 166 is formed.

Figure 8A:
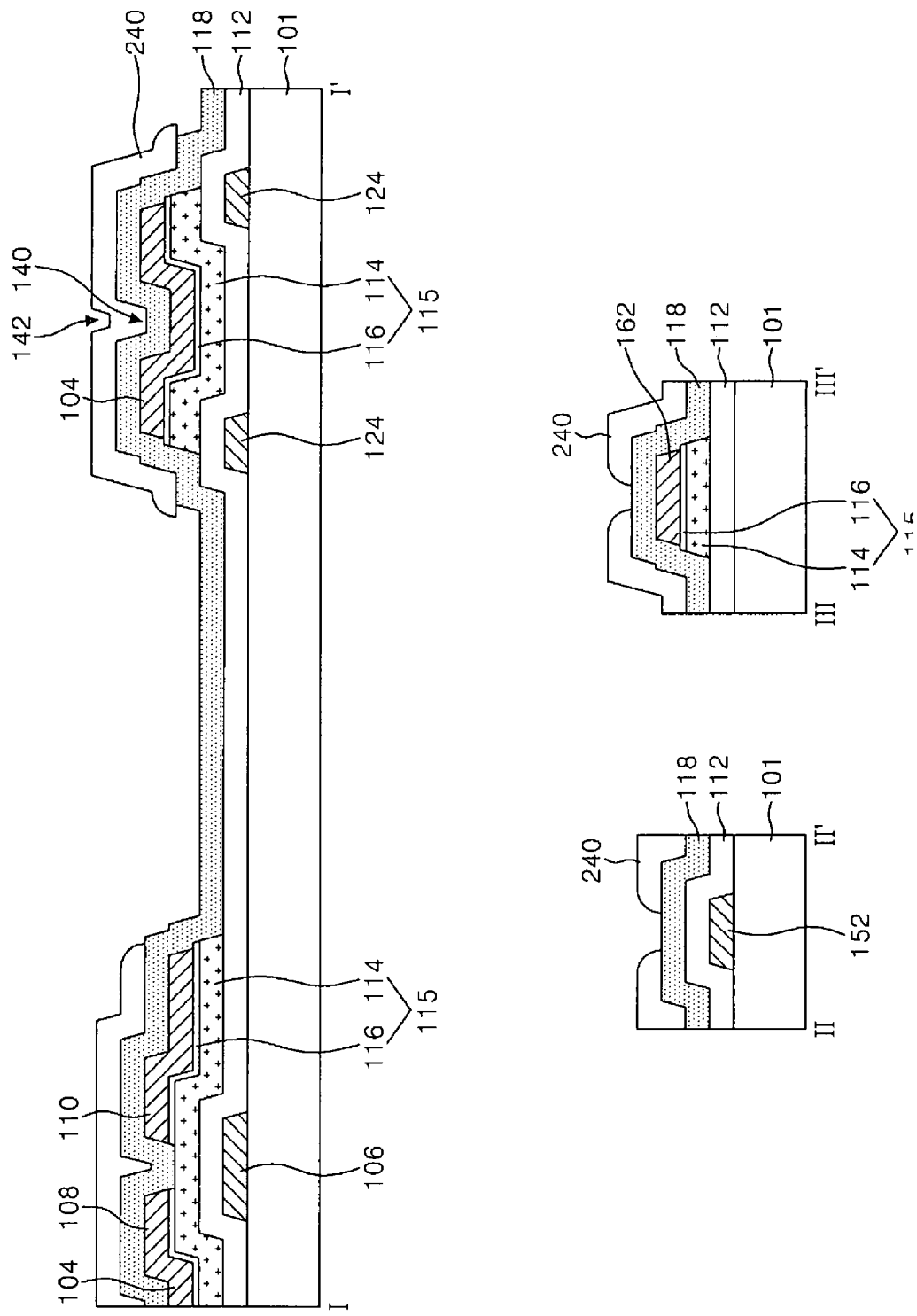

Specifically, as shown in FIG. 8a, passivation layer 118 is formed by, such as, a PECVD method, a spin coating method, a spinless coating method, etc. on the gate insulating layer 112 where the source/drain metal patterns are formed. Passivation layer 118 uses an inorganic material the same as the gate insulating layer 112 formed by, such as, for example, a CVD method, a PECVD method, etc. Alternatively, passivation layer 118 uses an inorganic material, such as, for example, the gate insulating layer 112, or an acryl-based organic compound, or an organic material, such as, BCB or PFCB, etc. Then, a photoresist is deposited on passivation layer 118 and then exposed and developed by a photolithography process to form the photoresist pattern 240 where the passivation layer will be formed. At this time, the photoresist pattern 240 is formed to have a second stepped-structure portion 142 along the stepped-structure portion 140 of passivation layer 118 formed to cover data line 104. Then, passivation layer 118 and the gate insulating layer 112 are patterned by an etching process using the photoresist pattern 240 to form the pixel hole 160, the gate contact hole 154, and the data contact hole 164, as shown in FIG. 8b. In this case, if the source/drain metals are a material etched by a dry etching, the drain electrode 110 not overlapping the photoresist pattern 240 and a part of the data pad upper electrode 166 are etched in company with the ohmic contact layer 116 and the active layer thereunder. As passivation layer 118 is over-etched with respect to the photoresist pattern 240, an edge portion of the photoresist pattern 240 is formed to protrude relative to side surfaces of passivation layer 118 as shown in FIG. 8c.

Then, as shown in FIG. 8c, a transparent layer 242 is formed by a deposition method, such as a sputtering, etc. all over the TFT substrate where the photoresist pattern 240 exists. The transparent conductive layer 242 uses ITO (Indium Tin Oxide) or TO (Tin Oxide), IZO (Indium Zinc Oxide), $SnO_2$, a-ITO, etc., for example.

At this time, the transparent layer 242 is deposited to be opened at an edge portion of the photoresist pattern 240 protruded relative to side surfaces of passivation layer 118, thereby making a stripper easily penetrate. Accordingly, this results in improving efficiency of a lift-off process which removes the photoresist pattern 240. Further, the transparent conductive layer is sparsely formed between fine cracks generated while the photoresist pattern 240 is ashed by an etching gas used for etching passivation layer 118. Accordingly, the fine cracks are used as a penetrating path of the stripper, thereby improving efficiency of a lift-off process.

Then, the photoresist pattern 240 and the transparent layer 242 formed thereon are removed together by a lift-off process to form the transparent conductive pattern including pixel electrode 122, the gate pad upper electrode 132, the data pad upper electrode 140. At this time, the photoresist pattern 240 formed in an area corresponding to the light blocking layer which is the stepped-structure occurring pattern 124 is easily lift-off from passivation layer 118 relative to the photoresist pattern formed in an area corresponding to a conventional light blocking layer. In other words, the penetrating path of the stripper is expanded by the second stepped-structure portion 142 of the photoresist pattern 240 formed in an area corresponding to the stepped-structure occurring pattern 124, thereby increasing a starting point of lift-off and improving efficiency of the lift-off process.

Pixel electrode 122 forms a boundary with passivation layer 118 patterned within the pixel hole 120 and electrically connected to the drain electrode 110. The gate pad upper electrode 156 forms a the boundary with the passivasion layer 118 patterned within the gate contact hole 154 and electrically connected to the gate pad lower electrode 152 formed thereunder. The data pad upper electrode 166 forms a boundary with passivation layer 118 patterned within the data contact hole 164 and electrically connected to a side surface of the data pad lower electrode 162.

Figure 10:
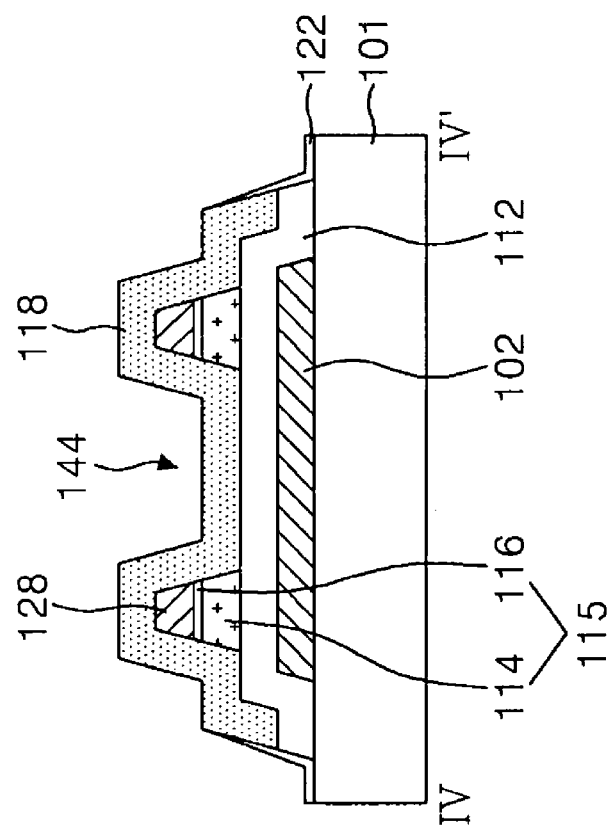
FIG. 10 is a cross-sectional view taken along line IV-IV' of the TFT substrate shown in FIG. 9.

FIG. 9 is a plan view showing a part of the TFT substrate in accordance with a second exemplary embodiment of the present invention and FIG. 10 is a cross-sectional view taken along line IV-IV' of the TFT substrate shown in FIG. 9.

The TFT substrate shown in FIGS. 9 and 10 comprises the same configuration as the TFT substrate shown in FIGS. 1 and 2, except that the stepped-structure occurring pattern 128 is formed to overlap gate line 102. Accordingly, the detailed description thereof will be omitted.

The stepped-structure occurring pattern 128 is formed to at least partially overlap with the gate line 104 and the gate insulating layer 112 interposed. The stepped-structure occurring pattern 128 is formed on the same plane as data line 104 and formed of the same material, and semiconductor pattern 115 including the active layer 114 and the ohmic contact layer 116 is formed thereunder. The stepped-structure occurring pattern 128 is formed to have a line width less than gate line 102 so as not to influence an aperture ratio.

The stepped-structure occurring pattern 128 is spaced apart from each other on the gate insulating layer 112. Alternatively, the stepped-structure occurring pattern 128 may be connected to each other by a connecting pattern (not shown) narrower than the stepped-structure occurring pattern 128. The connecting pattern may be formed to have a constant width or to gradually increase its width within the width of the stepped-structure occurring pattern 128 as it becomes increasingly close to the stepped-structure occurring pattern 128.

The stepped-structure occurring pattern 128 makes the stepped-structure portion 144. In particular, the stepped-structure portion is also formed in the photoresist pattern used for patterning passivation layer 118 and a transparent conductive pattern along the stepped-structure portion 144 formed in passivation layer 118 and used as a penetrating path of a stripper. In other words, the penetrating path of the stripper increases by the stepped-structure portion formed in the photoresist pattern, thereby improving efficiency of a lift-off process.

Meanwhile, while it has been described as an example that the TFT substrate according to the present invention comprises the stepped-structure occurring pattern overlapping the gate line or the data line, it should be noted that it may comprise a first stepped-structure occurring pattern overlapping the data line and a second stepped-structure occurring pattern overlapping the gate line.

As described the above, according to the TFT substrate and the method of manufacturing the TFT substrate of the present invention, the transparent conductive layer is patterned by lift-off of the photoresist pattern used for patterning the passivation layer to form the transparent conductive pattern. Accordingly, the TFT substrate and the method of manufacturing the TFT substrate according to the present invention may simplify many manufacturing processes (i.e. a three mask process).

Further, the TFT substrate and the method of manufacturing the TFT substrate according to the present invention form the stepped-structure occurring pattern so as to overlap the data line and the gate line. Due to the stepped-structure occurring pattern, the stepped-structure portion is formed on the surface of the passivation layer and in the photoresist pattern along the passivation layer. The stepped-structure portion is used as a penetrating path of a stripper, thereby improving efficiency of a lift-off process.

While this invention has been described in connection with what is presently considered to be practical exemplary embodiments, it is to be understood that various modifications and equivalent arrangements will be apparent to those skilled in the art and may be made without, however, departing from the spirit and scope of the invention.

What is claimed is:

1. A thin film transistor substrate comprising:
   a gate line formed on a substrate;
   a data line intersecting the gate line with a gate insulating layer interposed and defining a sub-pixel area with the gate line;
   a thin film transistor comprising a gate electrode connected to the gate line, a source electrode connected to the data line, a drain electrode facing the source electrode, and a semiconductor pattern forming a channel between the source and drain electrodes and overlapping the data line;
   a pixel electrode formed on the substrate of the sub-pixel area and connected to the thin film transistor;
   a passivation layer forming the boundary with the pixel electrode and formed in a remaining area except for an area where the pixel electrode is formed; and
   a stepped-structure occurring pattern partially overlapping at least one of the gate line and the data line and forming a stepped-structure portion on a surface of the passivation layer.

2. The thin film transistor substrate of claim 1, wherein the stepped-structure occurring pattern is formed of the same material as the gate line on the substrate so as to partially overlap the data line.

3. The thin film transistor substrate of claim 1, wherein the stepped-structure occurring pattern is formed of the same material as the data line on the gate insulating layer so as to partially overlap the gate line.

4. The thin film transistor substrate of claim 1, wherein the stepped-structure occurring pattern includes spaced apart segments.

5. The thin film transistor substrate of claim 4, further comprising a connecting pattern formed between segments of the stepped-structure occurring patterns so as to connect the stepped-structure occurring patterns to each other.

6. The thin film transistor substrate of claim 5, wherein the width of the connecting pattern is constant or gradually increases toward the stepped-structure occurring patterns.

7. The thin film transistor substrate of claim 1, further comprising a gate pad electrically connected to the gate line, wherein the gate pad comprises:
   a gate pad lower electrode extended from the gate line; and
   a gate pad upper electrode formed within a contact hole penetrating the passivation layer and the gate insulating layer and connected to the gate pad lower electrode.

8. The thin film transistor substrate of claim 1, further comprising a data pad connected to the data line, wherein the data pad comprises:

a data pad lower electrode extended from the data line; and a data pad upper electrode formed within a contact hole penetrating the data pad lower electrode, and the passivation layer and connected to the data pad lower electrode.

* * * * *